(12) United States Patent
Li

(10) Patent No.: US 12,027,088 B2
(45) Date of Patent: Jul. 2, 2024

(54) SHIFT REGISTER, GATE DRIVER CIRCUIT, AND DISPLAY DEVICE

(71) Applicant: TCL CHINA STAR OPTOELECTRONICS TECHNOLOGY CO., LTD., Guangdong (CN)

(72) Inventor: Jialong Li, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/754,972

(22) PCT Filed: Mar. 30, 2022

(86) PCT No.: PCT/CN2022/084113
§ 371 (c)(1),
(2) Date: Apr. 18, 2022

(87) PCT Pub. No.: WO2023/173492
PCT Pub. Date: Sep. 21, 2023

(65) Prior Publication Data
US 2024/0153420 A1    May 9, 2024

(30) Foreign Application Priority Data

Mar. 18, 2022    (CN) .......................... 202210271496.0

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2310/0267* (2013.01); *G09G 2310/0286* (2013.01); *G09G 2320/0257* (2013.01)

(58) Field of Classification Search
CPC ............. G09G 3/20; G09G 2310/0267; G09G 2310/0286; G09G 2320/0257; G11C 19/28
See application file for complete search history.

(56) References Cited

U.S. PATENT DOCUMENTS

2018/0197448 A1* 7/2018 Zhang ....................... G11C 7/02
2018/0204628 A1* 7/2018 Gao ...................... G11C 19/184
(Continued)

FOREIGN PATENT DOCUMENTS

| CN | 208384966 U | 1/2019 |
| CN | 109859670 A | 6/2019 |
| CN | 113990378 A | 1/2022 |

OTHER PUBLICATIONS

International Search Report in International application No. PCT/CN2022/084113, dated Dec. 16, 2022.
(Continued)

*Primary Examiner* — Premal R Patel

(57) ABSTRACT

A shift register, a gate driver circuit, and a display device are disclosed. In the shift register, when a pull-up node is at a low level, a third signal control end controls a conduction of a first noise reduction module and provides the pull-up node with a low-level signal of a first power supply end, so as to pull down a signal of the pull-up node to reduce noise. Therefore, an issue of noise interference on an output end of a gate driving signal is solved when a clock signal provided by a clock signal end is at a high level.

20 Claims, 4 Drawing Sheets

(56) References Cited

U.S. PATENT DOCUMENTS

2020/0357352 A1* 11/2020 Du .................. G09G 3/3696
2021/0012847 A1   1/2021 Cheng
2021/0035480 A1*  2/2021 Zou .................. G11C 19/28
2021/0056880 A1*  2/2021 Mou ................. G11C 19/28

OTHER PUBLICATIONS

Written Opinion of the International Search Authority in International application No. PCT/CN2022/084113, dated Dec. 16, 2022.

* cited by examiner

SHIFT REGISTER, GATE DRIVER CIRCUIT, AND DISPLAY DEVICE

FIELD OF INVENTION

The present application relates to the field of display technologies, and more particularly to a shift register, a gate driver circuit, and a display device.

BACKGROUND OF INVENTION

Display devices, as display components of electronic devices, have been widely used in various electronic products. A gate driver circuit is an important part of the display device. The gate driver circuit may also be called a GOA (gate driver on array) circuit, which utilizes an array process of a thin film transistor display to manufacture a gate row scanning driving signal circuit on an array substrate. This is a technique that implements a progressive scan driving method for the gate.

Each GOA unit acts as a shift register to transmit a scan signal to the next GOA unit in turn. Thin film transistor switches are turned on row by row, and a data signal input of a pixel is completed. In the related art, due to the inherent characteristics of thin film transistor devices, long-term reliability or under some specific use conditions, thin film transistor characteristics drift. As a result, even if a gate of the output transistor included in the shift register maintains a good off-voltage, good off-characteristics cannot be maintained. That is, during an output off-holding period, the output transistor can also be turned on. As a result, when a clock signal provided by a clock signal end is at a high level during the output off-holding period, noise interference is generated on an output end of a gate driving signal. This makes a screen wrongly charged, resulting in abnormal display.

Technical Problem

The present application provides a shift register, a gate driver circuit, and a display device to solve an issue of noise interference on an output end of a gate driving signal when a clock signal provided by a clock signal end is at a high level.

SUMMARY OF INVENTION

The present application provides a shift register, which includes:
  an input module, wherein the input module is connected to a signal input end, a first signal control end, and a pull-up node, and the input module is configured to provide a signal of the signal input end to the pull-up node under a control of the first signal control end;
  an output module, wherein the output module is connected to the pull-up node, a clock signal end, and a signal output end, and the output module is configured to provide a clock signal of the clock signal end to the signal output end under a control of the pull-up node;
  a reset module, wherein the reset module is connected to the pull-up node, a second signal control end, and a first power supply end, and the output module is configured to provide the clock signal of the clock signal end to the signal output end under the control of the pull-up node; and
  a first noise reduction module, wherein the first noise reduction module is connected to the pull-up node, a third signal control end, and the first power supply end, and the first noise reduction module is configured to provide a signal of the first power supply end to the pull-up node under the control of the pull-up node and a control of the third signal control end.

Optionally, in some embodiments of the present application, the first noise reduction module is further connected to the signal output end, and the first noise reduction module is configured to provide the signal of the first power supply end to the signal output end under the control of the pull-up node and the control of the third signal control end.

Optionally, in some embodiments of the present application, the shift register further comprises a second noise reduction module, the second noise reduction module is connected to the pull-up node, a fourth signal control end, and the first power supply end, and the second noise reduction module is configured to provide the signal of the first power supply end to the pull-up node under the control of the pull-up node and a control of the fourth signal control end.

Optionally, in some embodiments of the present application, the second noise reduction module is further connected to the signal output end, the second noise reduction module is configured to provide the signal of the first power supply end to the signal output end under the control of the pull-up node and the control of the fourth signal control end.

Optionally, in some embodiments of the present application, the shift register further comprises a shutdown control module, the shutdown control module is connected to the first power supply end, a second power supply end, and the signal output end, and the shutdown control module is configured to provide a turn-on signal to the signal output end under the control of the first power supply end and a control of the second power supply end, such that thin film transistors connected to gate lines of a corresponding row are all turned on.

Optionally, in some embodiments of the present application, the input module comprises a first transistor, a gate of the first transistor is connected to the first signal control end, one of a source and a drain of the first transistor is connected to the signal input end, and another of the source and the drain of the first transistor is connected to the pull-up node.

Optionally, in some embodiments of the present application, the output module comprises a second transistor and a first capacitor, a gate of the second transistor is connected to the pull-up node, one of a source and a drain of the second transistor is connected to the clock signal end, and another of the source and the drain of the second transistor is connected to the signal output end; and
  one end of the first capacitor is connected to the pull-up node, and another end of the first capacitor is connected to the signal output end.

Optionally, in some embodiments of the present application, the reset module comprises a third transistor, a gate of the third transistor is connected to the second signal control end, one of a source and a drain of the third transistor is connected to the pull-up node, and another of the source and the drain of the third transistor is connected to the first power supply end.

Optionally, in some embodiments of the present application, the first noise reduction module comprises a fourth transistor and a fifth transistor, the fifth transistor is a P-type transistor, a gate of the fourth transistor is connected to the third signal control end, one of a source and a drain of the fourth transistor is connected to the pull-up node, another of the source and drain of the fourth transistor is connected to a gate of the fifth transistor, one of a source and a drain of the fifth transistor is connected to the pull-up node, and another of the source and the drain of the fifth transistor is connected to the first power supply end.

Optionally, in some embodiments of the present application, the first noise reduction module comprises a fourth transistor, a first inverter, and a fifth transistor, a gate of the fourth transistor is connected to the third signal control end, one of a source and a drain of the fourth transistor is connected to the pull-up node, another of the source and the drain of the fourth transistor is connected to an input end of the first inverter, an output end of the first inverter is connected to a gate of the fifth transistor, one of a source and a drain of the fifth transistor is connected to the pull-up node, and another of the source and the drain of the fifth transistor is connected to the first power supply end.

Optionally, in some embodiments of the present application, the first noise reduction module further comprises a sixth transistor, the sixth transistor is a P-type transistor, a gate of the sixth transistor is connected to the another of the source and the drain of the fourth transistor, one of a source and a drain of the sixth transistor is connected to the signal output end, and another of the source and the drain of the sixth transistor is connected to the first power supply end.

Optionally, in some embodiments of the present application, the first noise reduction module further comprises a second inverter and a sixth transistor, an input end of the second inverter is connected to the another of the source and the drain of the fourth transistor, an output end of the second inverter is connected to a gate of the sixth transistor, one of a source and a drain of the sixth transistor is connected to the signal output end, and another of the source and the drain of the sixth transistor is connected to the first power supply end.

Optionally, in some embodiments of the present application, the second noise reduction module comprises a seventh transistor and an eighth transistor, the eighth transistor is a P-type transistor, a gate of the seventh transistor is connected to the fourth signal control end, one of a source and a drain of the seventh transistor is connected to the pull-up node, another of the source and the drain of the seventh transistor is connected to a gate of the eighth transistor, one of a source and a drain of the eighth transistor is connected to the pull-up node, and another of the source and the drain of the eighth transistor is connected to the first power supply end.

Optionally, in some embodiments of the present application, the second noise reduction module comprises a seventh transistor, a third inverter, and an eighth transistor, a gate of the seventh transistor is connected to the third signal control end, one of a source and a drain of the seventh transistor is connected to the pull-up node, another of the source and the drain of the seventh transistor is connected to an input end of the third inverter, an output end of the third inverter is connected to a gate of the eighth transistor, one of a source and a drain of the eighth transistor is connected to the pull-up node, and another of the source and the drain of the eighth transistor is connected to the first power supply end.

Optionally, in some embodiments of the present application, the second noise reduction module further comprises a ninth transistor, the ninth transistor is a P-type transistor, a gate of the ninth transistor is connected to the another of the source and the drain of the seventh transistor, one of a source and a drain of the ninth transistor is connected to the signal output end, and another of the source and the drain of the ninth transistor is connected to the first power supply end.

Optionally, in some embodiments of the present application, the second noise reduction module further comprises a fourth inverter and a ninth transistor, an input end of the fourth inverter is connected to the another of the source and the drain of the seventh transistor, an output end of the fourth inverter is connected to a gate of the ninth transistor, one of a source and a drain of the ninth transistor is connected to the signal output end, and another of the source and drain of the ninth transistor is connected to the first power supply end.

Optionally, in some embodiments of the present application, the shutdown control module comprises a second capacitor and a tenth transistor, a gate of the tenth transistor is connected to the first power supply end, one of a source and a drain of the tenth transistor is connected to the second power supply end, another of the source and the drain of the tenth transistor is connected to the signal output end, one end of the second capacitor is connected to the first power supply end, and another end of the second capacitors is connected to the second power supply end.

Correspondingly, the present application further provides a gate drive circuit, which includes: a plurality of cascaded shift registers, wherein a signal input end of a first stage shift register is connected to an initial signal end, a signal output end of an Nth stage shift register is connected to a signal input end of an N+1 th stage shift register, a signal output end of the N+1th stage shift register is connected to a reset signal end of the Nth stage shift register, N≥1; wherein one of the shift registers comprises:
    an input module, wherein the input module is connected to a signal input end, a first signal control end, and a pull-up node, and the input module is configured to provide a signal of the signal input end to the pull-up node under a control of the first signal control end;
    an output module, wherein the output module is connected to the pull-up node, a clock signal end, and a signal output end, and the output module is configured to provide a clock signal of the clock signal end to the signal output end under a control of the pull-up node;
    a reset module, wherein the reset module is connected to the pull-up node, a second signal control end, and a first power supply end, and the output module is configured to provide the clock signal of the clock signal end to the signal output end under the control of the pull-up node; and
    a first noise reduction module, wherein the first noise reduction module is connected to the pull-up node, a third signal control end, and the first power supply end, and the first noise reduction module is configured to provide a signal of the first power supply end to the pull-up node under the control of the pull-up node and a control of the third signal control end.

Optionally, in some embodiments of the present application, the one of the shift registers further comprises a second noise reduction module, the second noise reduction module is connected to the pull-up node, a fourth signal control end, and the first power supply end, and the second noise reduction module is configured to provide the signal of the first power supply end to the pull-up node under the control of the pull-up node and a control of the fourth signal control end.

Correspondingly, the present application further provides a display device, which includes: a gate driver circuit comprising a plurality of cascaded shift registers, wherein a signal input end of a first stage shift register is connected to an initial signal end, a signal output end of an Nth stage shift register is connected to a signal input end of an N+1 th stage shift register, a signal output end of the N+1th stage shift register is connected to a reset signal end of the Nth stage shift register, N≥1; wherein one of the shift registers comprises:

an input module, wherein the input module is connected to a signal input end, a first signal control end, and a pull-up node, and the input module is configured to provide a signal of the signal input end to the pull-up node under a control of the first signal control end;

an output module, wherein the output module is connected to the pull-up node, a clock signal end, and a signal output end, and the output module is configured to provide a clock signal of the clock signal end to the signal output end under a control of the pull-up node;

a reset module, wherein the reset module is connected to the pull-up node, a second signal control end, and a first power supply end, and the output module is configured to provide the clock signal of the clock signal end to the signal output end under the control of the pull-up node; and a first noise reduction module, wherein the first noise reduction module is connected to the pull-up node, a third signal control end, and the first power supply end, and the first noise reduction module is configured to provide a signal of the first power supply end to the pull-up node under the control of the pull-up node and a control of the third signal control end.

Beneficial Effect:

A shift register, a gate driver circuit, and a display device are disclosed. The shift register comprises an input module, wherein the input module is connected to a signal input end, a first signal control end, and a pull-up node, and the input module is configured to provide a signal of the signal input end to the pull-up node under a control of the first signal control end; an output module, wherein the output module is connected to the pull-up node, a clock signal end, and a signal output end, and the output module is configured to provide a clock signal of the clock signal end to the signal output end under a control of the pull-up node; a reset module, wherein the reset module is connected to the pull-up node, a second signal control end, and a first power supply end, and the output module is configured to provide the clock signal of the clock signal end to the signal output end under the control of the pull-up node; and a first noise reduction module, wherein the first noise reduction module is connected to the pull-up node, a third signal control end, and the first power supply end, and the first noise reduction module is configured to provide a signal of the first power supply end to the pull-up node under the control of the pull-up node and a control of the third signal control end. In the present application, when the pull-up node is at a low level, the third signal control end controls a conduction of the first noise reduction module and provides the pull-up node with a low-level signal of the first power supply end, so as to pull down a signal of the pull-up node to reduce noise. Therefore, an issue of noise interference on an output end of a gate driving signal is solved when the clock signal provided by the clock signal end is at a high level.

DESCRIPTION OF DRAWINGS

In order to illustrate the technical solutions in the embodiments of the present application more clearly, the following briefly introduces the accompanying drawings that are used in the description of the embodiments. Obviously, the drawings in the following description are only some embodiments of the present application. For those skilled in the art, other drawings can also be obtained from these drawings without creative effort.

DETAILED DESCRIPTION OF PREFERRED EMBODIMENTS

Figure 1:
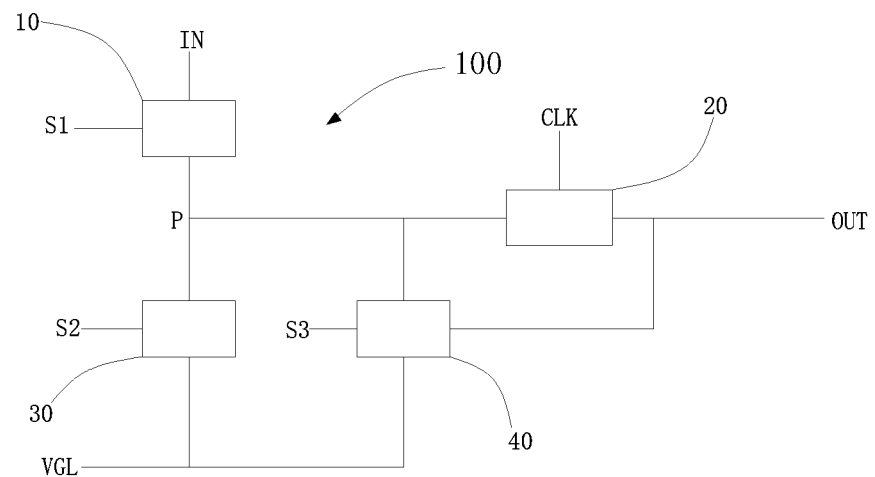
FIG. 1 is a schematic diagram of a first structure of a shift register provided by the present application.

The technical solutions in the embodiments of the present application will be clearly and completely described below with reference to the accompanying drawings in the embodiments of the present application. Obviously, the described embodiments are only a part of the embodiments of the present application, but not all of the embodiments. Based on the embodiments in this application, all other embodiments obtained by those skilled in the art without creative efforts shall fall within the protection scope of this application.

In the description of the present application, it should be understood that the terms "first" and "second" are only used for description purposes, and cannot be interpreted as indicating or implying relative importance or implicitly indicating the number of indicated technical features. Thus, features defined as "first" and "second" may expressly or implicitly include one or more of the features. In the description of the present application, "plurality" means two or more, unless otherwise expressly and specifically defined.

Transistors used in all the embodiments of the present application may be thin film transistors or field effect transistors or other devices with the same characteristics. Because a source and a drain of the transistor used here are symmetrical, the source and drain are interchangeable. In the embodiments of the present application, in order to distinguish two electrodes of the transistor except a gate, one electrode is called the source, and the other electrode is called the drain. According to the form in the drawings, a middle end of a control module is the gate, a signal input end is the source, and an output end is the drain. In addition, the transistors used in the embodiments of the present application may include both P-type transistors and/or N-type transistors. P-type transistor is turned on when the gate is low and turned off when the gate is high. N-type transistor is turned on when the gate is high and turned off when the gate is low.

The present application provides a shift register, a gate driver circuit, and a display device, which will be described in detail below. It should be noted that the description order of the following embodiments is not intended to limit the preferred order of the embodiments of the present application.

Refer to FIG. 1, which is a schematic diagram of a first structure of a shift register 100 provided by the present application. The present application provides a shift register 100, which includes an input module 10, an output module 20, a reset module 30, and a first noise reduction module 40.

The input module 10 is connected to a signal input end IN, a first signal control end S1, and a pull-up node P. The input module 10 is configured to provide a signal of the signal input end IN to the pull-up node P under a control of the first signal control end S1.

The output module 20 is connected to the pull-up node P, a clock signal end CLK, and a signal output end OUT. The output module 20 is configured to provide a clock signal of the clock signal end CLK to the signal output end OUT under a control of the pull-up node P.

The reset module 30 is connected to the pull-up node P, a second signal control end S2, and a first power supply end VGL. The reset module 30 provides a signal of the first power supply end VGL to the pull-up node P under a control of the second signal control end S2.

The first noise reduction module 40 is connected to the pull-up node P, a third signal control end S3, and the first power supply end VGL. The first noise reduction module 40 provides the pull-up node P with the signal of the first power supply end VGL under the control of the pull-up node P and a control of the third signal control end S3.

Specifically, in the working process, the input module 10 provides the signal of the signal input end IN to the pull-up node P under the control of the first signal control end S1. This makes the potential of the pull-up node P at a high level. Next, the output module 20 is turned on under the control of the pull-up node P, and provides the clock signal of the clock signal end CLK to the signal output end OUT. Then, the reset module 30 provides the pull-up node P with the signal of the first power supply end VGL under the control of the second signal control end S2, and the potential of the pull-up node P is pulled down to a low level. Finally, under the control of the low level of the pull-up node P and the control of the third signal control end S3, the first noise reduction module 40 provides the pull-up node P with the signal of the first power supply end VGL, and the potential of the pull-up node P is continuously pulled down. Even if the clock signal provided by the clock signal end CLK is at a high level, the output module 20 cannot provide the clock signal of the clock signal end CLK to the signal output end OUT. Therefore, noise can be reduced, thereby solving the issue of noise interference on the gate driving signal output end OUT when the clock signal provided by the clock signal end CLK is at a high level.

In some embodiments, the first noise reduction module 40 is further connected to the signal output end OUT. The first noise reduction module 40 provides the signal of the first power supply end VGL to the signal output end OUT under the control of the pull-up node P and the control of the third signal control end S3.

That is, after the reset module 30 pulls down the potential of the pull-up node P to a low level, under the control of the low level of the pull-up node P and the control of the third signal control end S3, the first noise reduction module 40 provides the signal of the first power supply end VGL to the signal output end OUT, and the potential of the signal output end OUT is pulled down. Even if the clock signal provided by the clock signal end CLK is at a high level, the signal output end OUT outputs a low-level signal. Therefore, the noise can be further reduced.

Figure 2:
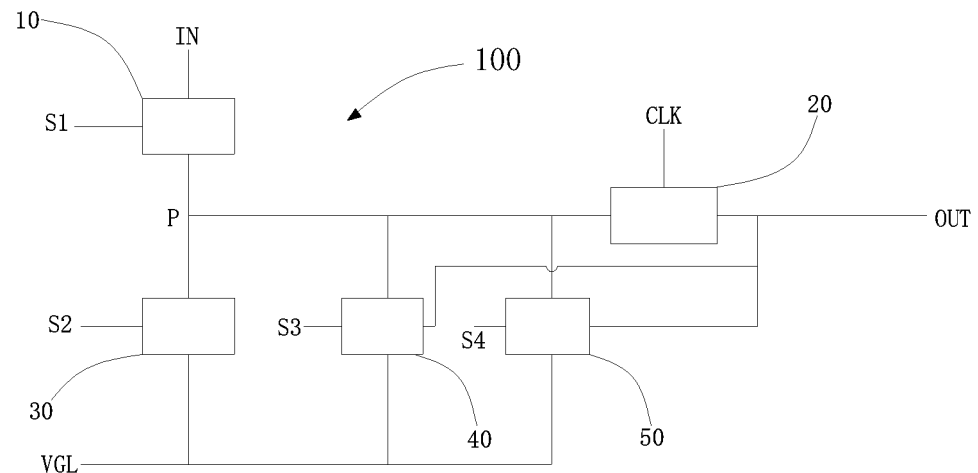
FIG. 2 is a schematic diagram of a second structure of a shift register provided by the present application.

Refer to FIG. 2, which is a schematic diagram of a second structure of the shift register 100 provided by the present application. The difference between this embodiment and the shift register 100 provided in FIG. 1 is that the shift register 100 further includes a second noise reduction module 50. The second noise reduction module 50 is connected to the pull-up node P, a fourth signal control end S4, and the first power supply end VGL. The second noise reduction module 50 provides the pull-up node P with the signal of the first power supply end VGL under the control of the pull-up node P and the control of the fourth signal control end S4.

That is, after the reset module 30 pulls down the potential of the pull-up node P to a low level, under the control of the low level of the pull-up node P and the control of the fourth signal control end S4, the second noise reduction module 50 provides the pull-up node P with the signal of the first power supply end VGL, and the potential of the pull-up node P is continuously pulled down. Even if the clock signal provided by the clock signal end CLK is at a high level, the output module 20 cannot provide the clock signal of the clock signal end CLK to the signal output end OUT. Therefore, noise can be reduced. Moreover, the first noise reduction module 40 and the second noise reduction module 50 are controlled by different signals, such that the first noise reduction module 40 and the second noise reduction module 50 can be turned on alternately by the third signal control end S3 and the fourth signal control end S4. This enables the first noise reduction module 40 and the second noise reduction module 50 to alternately pull down the potential of the pull-up node P continuously, thereby continuously reducing noise.

In some embodiments, the second noise reduction module 50 is further connected to the signal output end OUT. The second noise reduction module 50 provides the signal of the first power supply end VGL to the signal output end OUT under the control of the pull-up node P and the control of the fourth signal control end S4.

That is, after the reset module 30 pulls down the potential of the pull-up node P to a low level, under the control of the low level of the pull-up node P and the control of the fourth signal control end S4, the second noise reduction module 50 provides the signal of the first power supply end VGL to the signal output end OUT and pulls down the potential of the signal output end OUT. Even if the clock signal provided by the clock signal end CLK is at a high level, the signal output end OUT outputs a low-level signal. Therefore, the noise can be further reduced.

Figure 3:
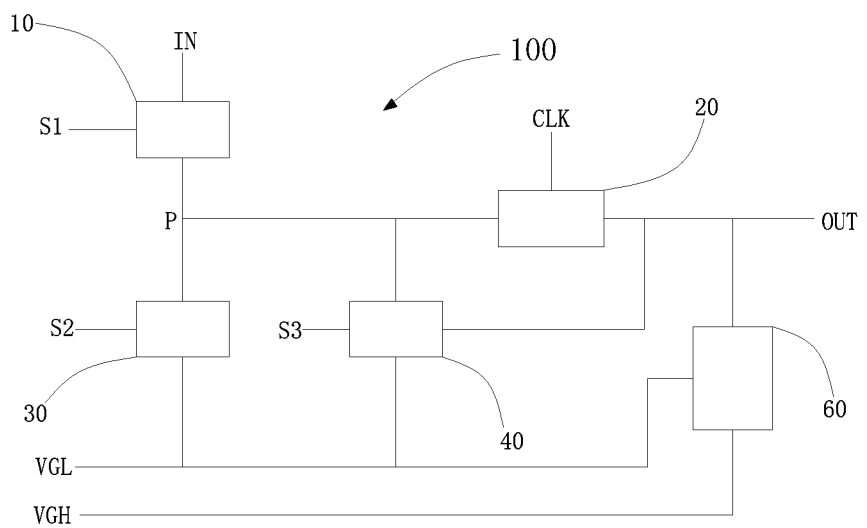
FIG. 3 is a schematic diagram of a third structure of a shift register provided by the present application.

Refer to FIG. 3, which is a schematic diagram of a third structure of the shift register 100 provided by the present application. In this embodiment, the difference between this embodiment and the shift register 100 provided in FIG. 1 is that the shift register 100 further includes a shutdown control module 60. The shutdown control module 60 is connected to the first power supply end VGL, the second power supply end VGH, and the signal output end OUT. The shutdown control module 60 is configured to provide a turn-on signal to the signal output end OUT under the control of the first power supply end VGL and the control of the second power supply end VGH. This turns on the thin film transistors connected to the corresponding row gate lines.

The liquid crystal display panel in the prior art has a gate line turn-on function at the moment of shutdown. The gate line turn-on function at the moment of shutdown is to trigger the turn-on signal of each GOA unit to output the thin film transistor through the gate line turn-on signal at the moment of shutdown. This enables the thin film transistors of all rows to be turned on, thereby releasing the charges stored in the pixel storage capacitors and parasitic capacitors, and avoiding poor power-off afterimages.

Based on the above issues, the present application is provided with the shutdown control module 60. In a display stage, the first power supply end VGL continues to provide a low-level signal, and the second power supply end VGH continues to provide a high-level signal. When the gate line turn-on function at the moment of shutdown is activated, the signal of the first power supply end VGL is the gate line turn-on signal at the moment of shutdown. The gate line turn-on signal at the moment of shutdown is a high level, and the signal of the second power supply end VGH is also a high level. The voltage of the signal at the second power supply end VGH is the same as the voltage of the gate line turn-on signal at the moment of shutdown.

The present application uses two signal ends, the first power supply end VGL and the second power supply end VGH, to control the supply of the turn-on signal to the signal output end OUT. Compared with the prior art, only the signal of the first power supply end VGL is used to control the supply of the turn-on signal to the signal output end OUT. When the gate line turn-on function at the moment of shutdown is realized, a driving capability of the gate line turn-on at the moment of shutdown is improved. This enables the pixels to discharge charges more fully, avoids charge residues, and improves a display performance.

Figure 4:
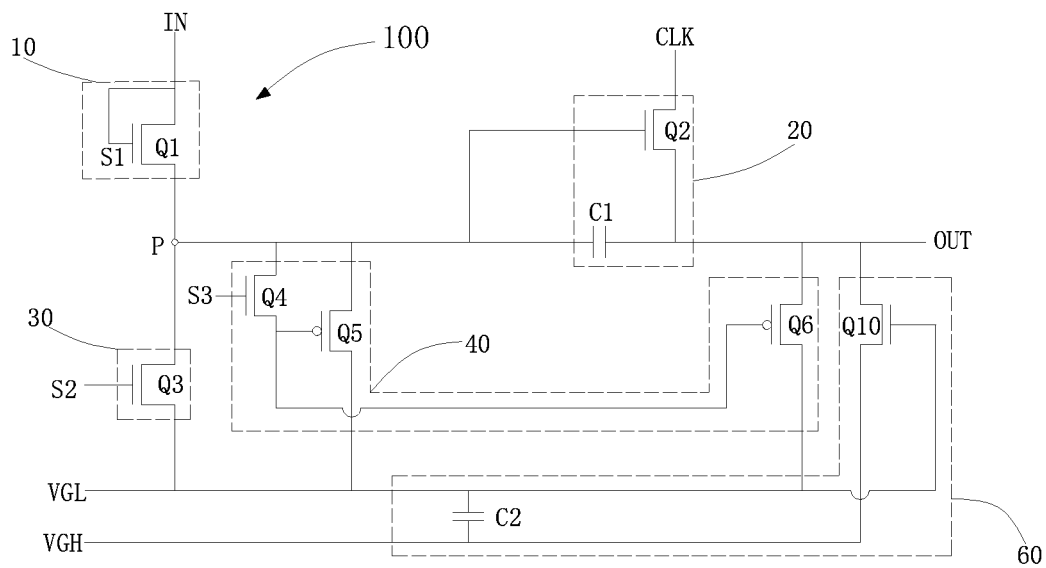
FIG. 4 is a schematic diagram of a fourth structure of a shift register provided by the present application.

Refer to FIG. 4, which is a schematic diagram of a fourth structure of the shift register 100 provided by the present application. In this embodiment, the input module 10 includes a first transistor Q1. The gate of the first transistor Q1 is connected to the first signal control end S1. One of the source and drain of the first transistor Q1 is connected to the signal input end IN. The other of the source and drain of the first transistor Q1 is connected to the pull-up node P. Specifically, the gate of the first transistor Q1 and one of the source and the drain of the first transistor Q1 are connected to the signal input end IN.

The output module 20 includes a second transistor Q2 and a first capacitor C1. The gate of the second transistor Q2 is connected to the pull-up node P. One of the source and the drain of the second transistor Q2 is connected to the clock signal end CLK. The other of the source and the drain of the second transistor Q2 is connected to the signal output end OUT.

One end of the first capacitor C1 is connected to the pull-up node P, and the other end of the first capacitor C1 is connected to the signal output end OUT.

The reset module 30 includes a third transistor Q3. The gate of the third transistor Q3 is connected to the second signal control end S2. One of the source and drain of the third transistor Q3 is connected to the pull-up node P. The other of the source and drain of the third transistor Q3 is connected to the first power supply end VGL.

The first noise reduction module 40 includes a fourth transistor Q4 and a fifth transistor Q5. The fifth transistor Q5 is a P-type transistor. The gate of the fourth transistor Q4 is connected to the third signal control end S3. One of the source and the drain of the fourth transistor Q4 is connected to the pull-up node P. The other of the source and the drain of the fourth transistor Q4 is connected to the gate of the fifth transistor Q5. One of the source and the drain of the fifth transistor Q5 is connected to the pull-up node P. The other of the source and the drain of the fifth transistor Q5 is connected to the first power supply end VGL.

The first noise reduction module 40 further includes a sixth transistor Q6. The sixth transistor Q6 is a P-type transistor. The gate of the sixth transistor Q6 is connected to the other of the source and the drain of the fourth transistor Q4. One of the source and the drain of the sixth transistor Q6 is connected to the signal output end OUT. The other of the source and the drain of the sixth transistor Q6 is connected to the first power supply end VGL.

The shutdown control module 60 includes a second capacitor C2 and a tenth transistor Q10. The gate of the tenth transistor Q10 is connected to the first power supply end VGL. One of the source and the drain of the tenth transistor Q10 is connected to the second power supply end VGH. The other of the source and the drain of the tenth transistor Q10 is connected to the signal output end OUT. One end of the second capacitor C2 is connected to the first power supply end VGL, and the other end of the second capacitor C2 is connected to the second power supply end VGH.

It should be noted that, FIG. 4 specifically shows exemplary structures of the input module 10, the output module 20, the reset module 30, the first noise reduction module 40, and the shutdown control module 60. Those skilled in the art can easily understand that the implementations of the input module 10, the output module 20, the reset module 30, the first noise reduction module 40, the second noise reduction module 50, and the shutdown control module 60 are not limited to this, as long as their functions can be achieved.

Figure 5:
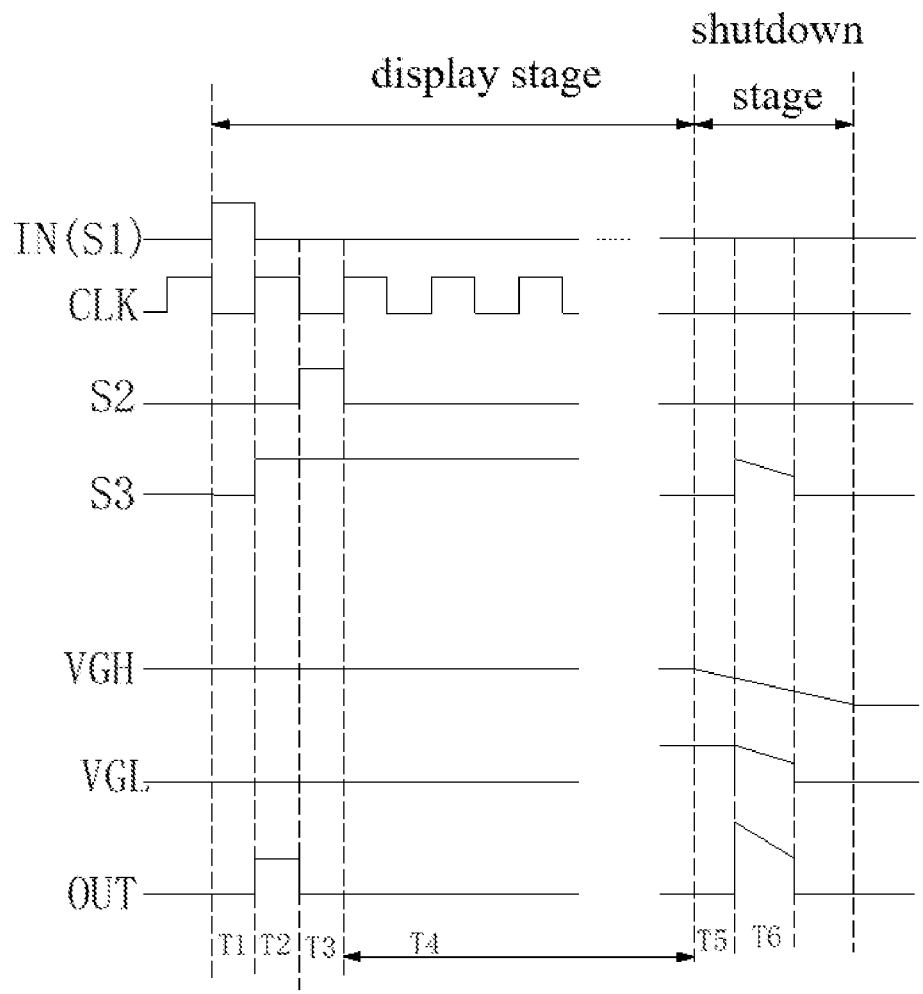
FIG. 5 is a schematic diagram of a working sequence of the fourth structure of the shift register provided by the present application.

Refer to FIG. 5, which is a schematic diagram of a working sequence of the fourth structure of the shift register provided by the present application. In a display stage, the first power supply end VGL continues to provide a low-level signal, and the second power supply end VGH continues to increase to increase the level signal. Specifically, the display stage includes the followings.

In a first stage T1, that is an input stage, an input signal of the signal input end IN is at a high level. The first transistor Q1 is turned on to pull up the potential of the pull-up node P to charge the first capacitor C1. In this stage, the input signal of the signal input end IN and the input signal of the third signal control end S3 are at a high level, the input signal of the reset signal end and the input signal of the clock signal end CLK are at a low level, and the output signal of the signal output end OUT is low level. Although the input signal of the third signal control end S3 is at a high level, the fourth transistor Q4 is turned on, and the other one of the source and the drain of the fourth transistor Q4 is at a high level. However, because the fifth transistor Q5 is a P-type transistor, the fifth transistor Q5 is turned off and may not pull down the potential of the pull-up node P.

A second stage T2 is an output stage. In this stage, the input signal of the clock signal end CLK and the input signal of the third signal control end S3 are at a high level. The input signal of the reset signal end and the input signal of the signal input end IN are at a low level. Due to a bootstrap effect of the first capacitor C1, the potential of the pull-up node P continues to be pulled high, the second transistor Q2 is turned on, and the output signal of the signal output end OUT is at a high level. Although the input signal of the third signal control end S3 is at a high level, the fourth transistor Q4 is turned on, and the other of the source and the drain of the fourth transistor Q4 is at a high level. However, because the fifth transistor Q5 is a P-type transistor, the fifth transistor Q5 is turned off and may not pull down the potential of the pull-up node P.

A third stage T3 is a reset stage. In this stage, the input signal of the reset signal end and the input signal of the third signal control end S3 are at a high level. The third transistor Q3 is turned on, the potential of the pull-up node P is pulled down, and the fourth transistor Q4 is turned on. The other of the source and the drain of the fourth transistor Q4 is at a low level. The fifth transistor Q5 is a P-type transistor, such that the fifth transistor Q5 is turned on to further pull down the potential of the pull-up node P to reduce noise. In addition, the input signal of the clock signal end CLK is at a high level, but because the potential of the pull-up node P is pulled down, the second transistor Q2 is turned off, and the output signal of the signal output end OUT is at a low level.

A fourth stage T4 is a noise reduction stage. In this stage, the input signal of the third signal control end S3 is at a high level. Due to the bootstrap effect of the first capacitor C1, the potential of the pull-up node P continues to be pulled down, and the fourth transistor Q4 is turned on. The other of the source and the drain of the fourth transistor Q4 is at a low level. The fifth transistor Q5 is a P-type transistor, such that the fifth transistor Q5 is turned on to further pull down the potential of the pull-up node P to continuously reduce noise. After the fourth stage T4, the shift register 100 of this stage keeps the noise reduction stage. The shift register 100 of this stage does not receive a high-level signal until the signal input end IN receives a high-level signal again.

A shutdown phase, specifically, include the followings.

In a fifth stage T5, after receiving the shutdown control signal, the signal of the first power supply end VGL is at a low level, and the tenth transistor Q10 is turned off. The signal of the second power supply end VGH starts to drop, and the signal of the third signal control end S3 whose input signal is at a high level starts to drop.

A sixth stage T6 is a realization stage of the gate line turn-on (hereinafter referred to as XON) function at the moment of shutdown. When the XON function is activated, the signal of the first power supply end VGL is pulled up to the high-level XON signal, and the tenth transistor Q10 is turned on. In addition, due to the bootstrap effect of the second capacitor C2, the voltage of the node N is bootstrapped to the sum of the voltage of the XON signal and the voltage of the second power supply end VGH. The voltage of the output signal of the signal output end OUT is equal to the sum of the voltage of the XON signal and the voltage of the signal of the second power supply end VGH. In addition, when the XON function is activated, the voltage of the signal at the second power supply end VGH is the voltage of the XON signal. Therefore, the voltage of the output signal of the signal output end OUT is equal to the voltage of the two XON signals, and this turns on the thin film transistors of the connected rows. When the signals at the third signal control end S3, the first power supply end VGL and the signal output end OUT drop to about 3.3V, the XON function ends.

The present application uses two signal ends, the first power end VGL and the second power end VGH, to control the supply of the turn-on signal to the signal output end OUT. Compared with the prior art, only the signal of the first power supply end VGL is used to control the supply of the turn-on signal to the signal output end OUT. When the gate line turn-on function at the moment of shutdown is realized, the driving capability of the gate line turn-on at the moment of shutdown is improved. This enables the pixels to discharge charges more fully, avoids charge residues, and improves a display performance.

Embodiments of the present application further provide a gate driver circuit, which includes a plurality of cascaded shift registers 100 as described above. A signal input end IN of a first stage shift register 100 is connected to an initial signal end. A signal output end OUT of an Nth stage shift register 100 is connected to a signal input end IN of an N+1th stage shift register 100. A signal output end OUT of the N+1th stage shift register 100 is connected to a reset signal end of the Nth stage shift register 100, and The problem-solving principle of the gate driver circuit is similar to that of the aforementioned shift register 100. Therefore, the implementation and beneficial effects of the gate driver circuit can be referred to the description of the aforementioned shift register 100, and the repetition is not repeated here.

Embodiments of the present application further provide a display device, which includes the gate driver circuit described above.

The problem-solving principle of the display device is similar to that of the aforementioned shift register 100. Therefore, the implementation and beneficial effects of the gate driver circuit can be referred to the description of the aforementioned shift register 100, and the repetition is not repeated here.

Figure 6:
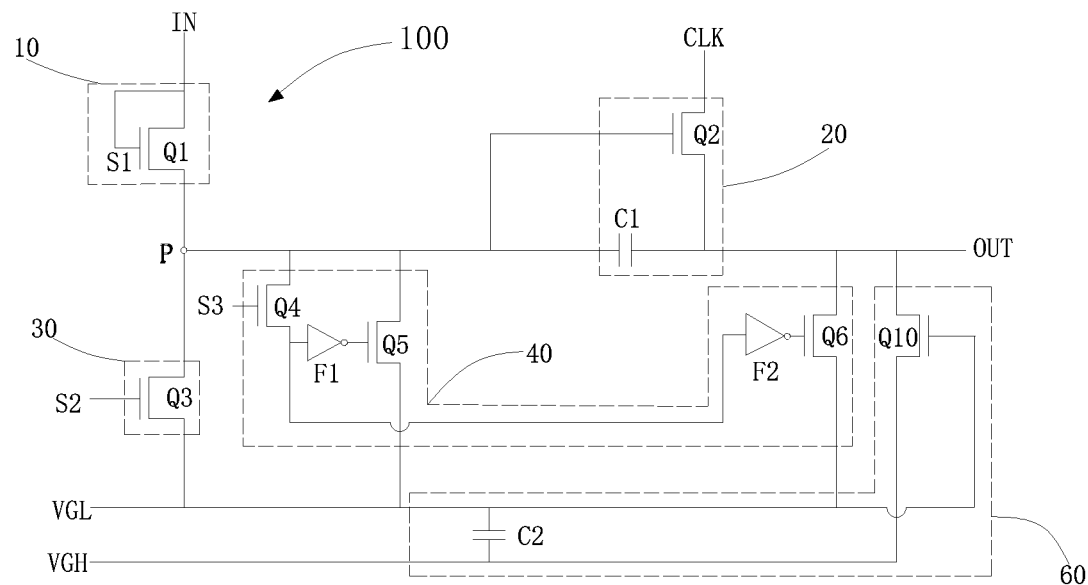
FIG. 6 is a schematic diagram of a fifth structure of a shift register provided by the present application.

Refer to FIG. 6, which is a schematic diagram of a fifth structure of the shift register 100 provided by the present application. The difference between this embodiment and the shift register 100 provided in FIG. 4 is that the first noise reduction module 40 includes a fourth transistor Q4, a first inverter F1, and a fifth transistor Q5. The gate of the fourth transistor Q4 is connected to the third signal control end S3. One of the source and the drain of the fourth transistor Q4 is connected to the pull-up node P. The other of the source and the drain of the fourth transistor Q4 is connected to the input end of the first inverter F1. The output end of the first inverter F1 is connected to the gate of the fifth transistor Q5. One of the source and the drain of the fifth transistor Q5 is connected to the pull-up node P. The other of the source and the drain of the fifth transistor Q5 is connected to the first power supply end VGL.

The first noise reduction module 40 further includes a second inverter F2 and a sixth transistor Q6. The input end of the second inverter F2 is connected to the other of the source and the drain of the fourth transistor Q4. The output end of the second inverter F2 is connected to the gate of the sixth transistor Q6. One of the source and the drain of the sixth transistor Q6 is connected to the signal output end OUT. The other of the source and the drain of the sixth transistor Q6 is connected to the first power supply end VGL.

Figure 7:
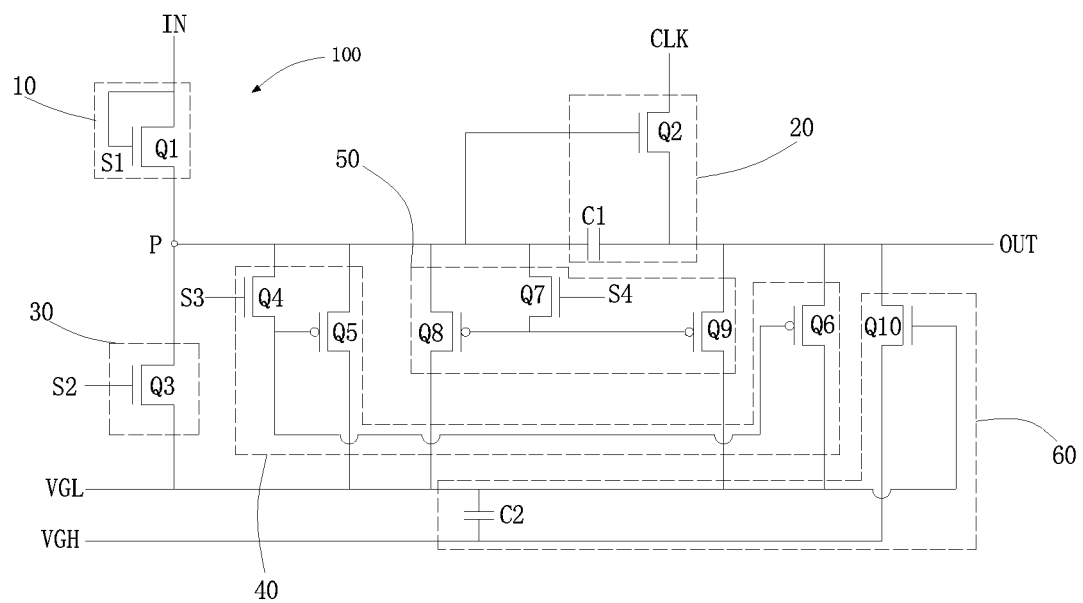
FIG. 7 is a schematic diagram of a sixth structure of a shift register provided by the present application.

Refer to FIG. 7, which is a schematic diagram of a sixth structure of the shift register 100 provided by the present application. The difference between this embodiment and the shift register 100 provided in FIG. 4 is that the second noise reduction module 50 includes a seventh transistor Q7 and an eighth transistor Q8. The eighth transistor Q8 is a P-type transistor. The gate of the seventh transistor Q7 is connected to the fourth signal control end S4. One of the source and the drain of the seventh transistor Q7 is connected to the pull-up node P. The other of the source and the drain of the seventh transistor Q7 is connected to the gate of the eighth transistor Q8. One of the source and the drain of the eighth transistor Q8 is connected to the pull-up node P, and the other of the source and the drain of the eighth transistor Q8 is connected to the first power supply end VGL.

Under the control of the low level of the pull-up node P and the fourth signal control end S4, the second noise reduction module 50 provides the pull-up node P with the signal of the first power supply end VGL. The potential of the pull-up node P is continuously pulled down. Even if the clock signal provided by the clock signal end CLK is at a high level, the output module 20 cannot provide the clock signal of the clock signal end CLK to the signal output end OUT. Therefore, noise can be reduced. Specifically, in the fourth stage T4, which is the noise reduction stage, the input signal of the fourth signal control end S4 is at a high level. Due to the bootstrap effect of the first capacitor C1, the potential of the pull-up node P continues to be pulled down. The seventh transistor Q7 is turned on, and the other of the source and the drain of the seventh transistor Q7 is at a low level. The eighth transistor Q8 is a P-type transistor, such that the eighth transistor Q8 is turned on. The potential of the pull-up node P is further pulled down to continuously reduce noise.

Moreover, the first noise reduction module 40 and the second noise reduction module 50 are controlled by different signals, such that the first noise reduction module 40 and the second noise reduction module 50 can be turned on alternately by the third signal control end S3 and the fourth signal control end S4. This enables the first noise reduction module 40 and the second noise reduction module 50 to continuously pull down the potential of the pull-up node P alternately, so as to continuously reduce noise. In addition, the transistor does not need to work for a long time, which prolongs the service life.

In some embodiments, the second noise reduction module 50 further includes a ninth transistor Q9. The ninth transistor Q9 is a P-type transistor. The gate of the ninth transistor Q9 is connected to the other of the source and the drain of the seventh transistor Q7. One of the source and the drain of the ninth transistor Q9 is connected to the signal output end OUT. The other one of the source and the drain of the ninth transistor Q9 is connected to the first power supply end VGL.

Figure 8:
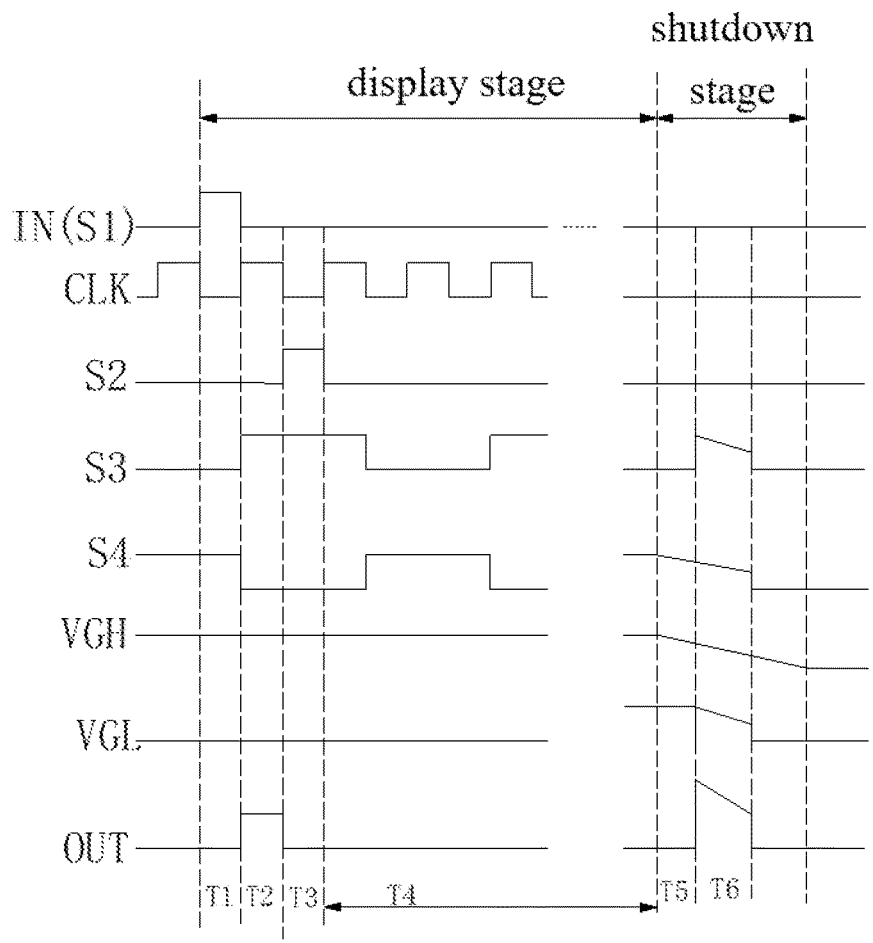
FIG. 8 is a schematic diagram of a working sequence of the sixth structure of the shift register provided by the present application.

Refer to FIG. 8, which is a schematic diagram of a working sequence of the sixth structure of the shift register provided by the present application. In a display stage, the first power supply end VGL continues to provide a low-level signal, and the second power supply end VGH continues to increase the level signal. Specifically, the display stage includes the followings.

In a first stage T1, that is an input stage, an input signal of the signal input end IN is at a high level. The first transistor Q1 is turned on to pull up the potential of the pull-up node P to charge the first capacitor C1. In this stage, the input signal of the signal input end IN and the input signal of the third signal control end S3 are at a high level, the input signal of the reset signal end and the input signal of the clock signal end CLK are at a low level, and the output signal of the signal output end OUT is low level. Although the input signal of the third signal control end S3 is at a high level, the fourth transistor Q4 is turned on, and the other one of the source and the drain of the fourth transistor Q4 is at a high level. However, because the fifth transistor Q5 is a P-type transistor, the fifth transistor Q5 is turned off and may not pull down the potential of the pull-up node P.

A second stage T2 is an output stage. In this stage, the input signal of the clock signal end CLK and the input signal of the third signal control end S3 are at a high level. The input signal of the reset signal end and the input signal of the signal input end IN are at a low level. Due to a bootstrap effect of the first capacitor C1, the potential of the pull-up node P continues to be pulled high, the second transistor Q2 is turned on, and the output signal of the signal output end OUT is at a high level. Although the input signal of the third signal control end S3 is at a high level, the fourth transistor Q4 is turned on, and the other of the source and the drain of the fourth transistor Q4 is at a high level. However, because the fifth transistor Q5 is a P-type transistor, the fifth transistor Q5 is turned off and may not pull down the potential of the pull-up node P.

A third stage T3 is a reset stage. In this stage, the input signal of the reset signal end and the input signal of the third signal control end S3 are at a high level. The third transistor Q3 is turned on, the potential of the pull-up node P is pulled down, and the fourth transistor Q4 is turned on. The other of the source and the drain of the fourth transistor Q4 is at a low level. The fifth transistor Q5 is a P-type transistor, such that the fifth transistor Q5 is turned on to further pull down the potential of the pull-up node P to reduce noise. In addition, the input signal of the clock signal end CLK is at a high level, but because the potential of the pull-up node P is pulled down, the second transistor Q2 is turned off, and the output signal of the signal output end OUT is at a low level.

A fourth stage T4 is a noise reduction stage. In this stage, the input signal of the third signal control end S3 or the input signal of the fourth signal control end S4 is at a high level. Due to the bootstrap effect of the first capacitor C1, the potential of the pull-up node P continues to be pulled down. When the input signal of the third signal control end S3 is at a high level, the fourth transistor Q4 is turned on, and the other one of the source and the drain of the fourth transistor Q4 is at a low level. The fifth transistor Q5 is a P-type transistor, such that the fifth transistor Q5 is turned on. The potential of the pull-up node P is further pulled down to continuously reduce noise. When the input signal of the fourth signal control end S4 is at a high level, the seventh transistor Q7 is turned on, and the other of the source and the drain of the seventh transistor Q7 is at a low level. The ninth transistor Q9 is a P-type transistor, such that the ninth transistor Q9 is turned on to pull down the potential of the signal output end OUT. Even if the clock signal provided by the clock signal end CLK is at a high level, the signal output end OUT outputs a low level signal, the noise can be further reduced. After the fourth stage T4, the shift register 100 of this stage maintains the noise reduction stage. The shift register 100 of this stage does not receive a high-level signal until the signal input end IN receives a high-level signal again.

A shutdown phase, specifically, include the followings.

In a fifth stage T5, after receiving the shutdown control signal, the signal of the first power supply end VGL is at a low level, and the tenth transistor Q10 is turned off. The signal of the second power supply end VGH starts to drop, and the signal of the third signal control end S3 whose input signal is at a high level starts to drop.

The second stage T6 is a realization stage of a gate line turn-on (hereinafter referred to as XON) function at the moment of shutdown. When the XON function is activated, the signal of the first power supply end VGL is pulled up to the high-level XON signal, and the tenth transistor Q10 is turned on. In addition, due to the bootstrap effect of the second capacitor C2, the voltage of the node N is bootstrapped to the sum of the voltage of the XON signal and the voltage of the second power supply end VGH. The voltage of the output signal of the signal output end OUT is equal to the sum of the voltage of the XON signal and the voltage of the signal of the second power supply end VGH. In addition, when the XON function is activated, the voltage of the signal at the second power supply end VGH is the voltage of the XON signal. Therefore, the voltage of the output signal of the signal output end OUT is equal to the voltage of the two XON signals. This turns on the thin film transistors of the connected rows. When the signals at the third signal control end S3, the first power supply end VGL and the signal output end OUT drop to about 3.3V, the XON function ends.

Figure 9:
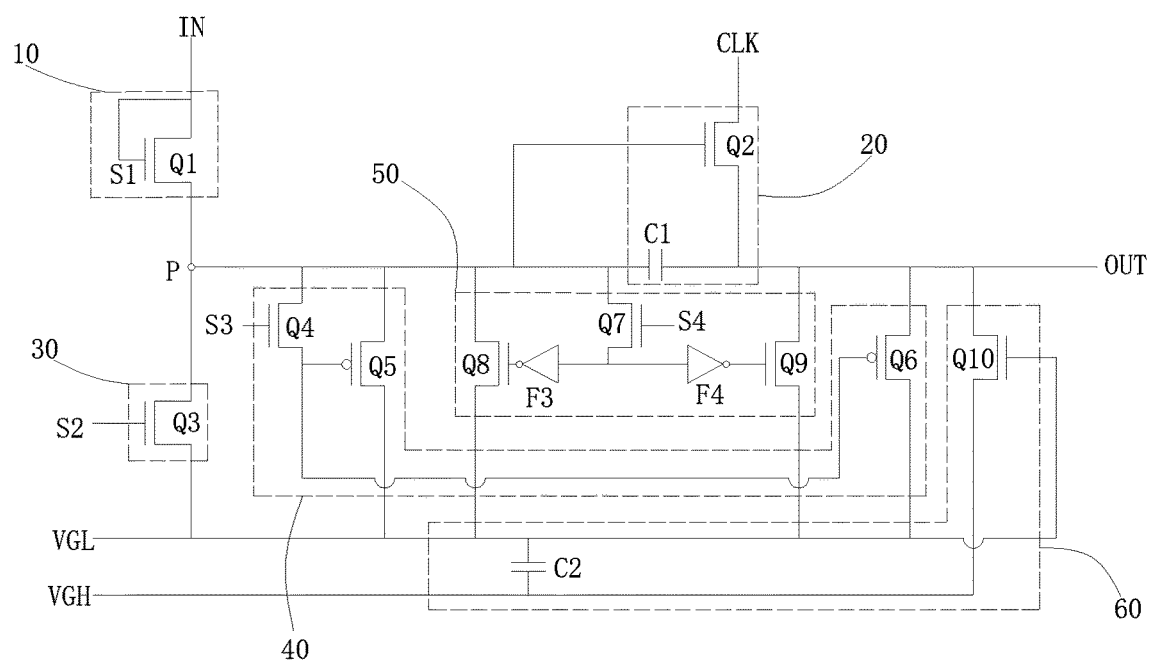
FIG. 9 is a schematic diagram of a seventh structure of a shift register provided by the present application.

Refer to FIG. 9, which is a seventh schematic structural diagram of the shift register 100 provided by the present application. The difference between this embodiment and the shift register 100 provided in FIG. 7 is that the second noise reduction module 50 includes a seventh transistor Q7, a third inverter F3, and an eighth transistor Q8. The gate of the seventh transistor Q7 is connected to the third signal control end S3. One of the source and the drain of the seventh transistor Q7 is connected to the pull-up node P. The other of the source and the drain of the seventh transistor Q7 is connected to the input end of the third inverter F3. The output end of the third inverter F3 is connected to the gate of the eighth transistor Q8. One of the source and the drain of the eighth transistor Q8 is connected to the pull-up node P. The other one of the source and the drain of the eighth transistor Q8 is connected to the first power supply end VGL.

The second noise reduction module 50 further includes a fourth inverter F4 and a ninth transistor Q9. The input end of the fourth inverter F4 is connected to the other of the source and the drain of the seventh transistor Q7. The output end of the fourth inverter F4 is connected to the gate of the ninth transistor Q9. One of the source and the drain of the ninth transistor Q9 is connected to the signal output end OUT. The other one of the source and the drain of the ninth transistor Q9 is connected to the first power supply end VGL.

The shift register, the gate driver circuit and the display device provided by the embodiments of the present application have been described in detail above. Specific examples are used herein to illustrate the principles and implementations of the present application. The descriptions of the above embodiments are only used to help understand the method and the core idea of the present application. In addition, for those skilled in the art, according to the idea of the present application, there will be changes in the specific embodiments and application scope. In conclusion, the content of this specification should not be construed as a limitation on this application.

What is claimed is:

1. A shift register, comprising:
an input module, wherein the input module is connected to a signal input end, a first signal control end, and a pull-up node, and the input module is configured to provide a signal of the signal input end to the pull-up node under a control of the first signal control end;
an output module, wherein the output module is connected to the pull-up node, a clock signal end, and a signal output end, and the output module is configured to provide a clock signal of the clock signal end to the signal output end under a control of the pull-up node;
a reset module, wherein the reset module is connected to the pull-up node, a second signal control end, and a first power supply end, and the output module is configured to provide the clock signal of the clock signal end to the signal output end under the control of the pull-up node; and
a first noise reduction module, wherein the first noise reduction module is connected to the pull-up node, a third signal control end, and the first power supply end, and the first noise reduction module is configured to provide a signal of the first power supply end to the pull-up node under the control of the pull-up node and a control of the third signal control end.

2. The shift register according to claim 1, wherein the first noise reduction module is further connected to the signal output end, and the first noise reduction module is configured to provide the signal of the first power supply end to the signal output end under the control of the pull-up node and the control of the third signal control end.

3. The shift register according to claim 1, wherein the shift register further comprises a second noise reduction module, the second noise reduction module is connected to the pull-up node, a fourth signal control end, and the first power supply end, and the second noise reduction module is configured to provide the signal of the first power supply end to the pull-up node under the control of the pull-up node and a control of the fourth signal control end.

4. The shift register according to claim 3, wherein the second noise reduction module is further connected to the signal output end, the second noise reduction module is configured to provide the signal of the first power supply end to the signal output end under the control of the pull-up node and the control of the fourth signal control end.

5. The shift register according to claim 3, wherein the second noise reduction module comprises a seventh transistor and an eighth transistor, the eighth transistor is a P-type transistor, a gate of the seventh transistor is connected to the fourth signal control end, one of a source and a drain of the seventh transistor is connected to the pull-up node, another of the source and the drain of the seventh transistor is connected to a gate of the eighth transistor, one of a source and a drain of the eighth transistor is connected to the pull-up node, and another of the source and the drain of the eighth transistor is connected to the first power supply end.

6. The shift register according to claim 3, wherein the second noise reduction module comprises a seventh transistor, a third inverter, and an eighth transistor, a gate of the seventh transistor is connected to the third signal control end, one of a source and a drain of the seventh transistor is connected to the pull-up node, another of the source and the drain of the seventh transistor is connected to an input end of the third inverter, an output end of the third inverter is connected to a gate of the eighth transistor, one of a source and a drain of the eighth transistor is connected to the pull-up node, and another of the source and the drain of the eighth transistor is connected to the first power supply end.

7. The shift register according to claim 5, wherein the second noise reduction module further comprises a ninth transistor, the ninth transistor is a P-type transistor, a gate of the ninth transistor is connected to the another of the source and the drain of the seventh transistor, one of a source and a drain of the ninth transistor is connected to the signal output end, and another of the source and the drain of the ninth transistor is connected to the first power supply end.

8. The shift register according to claim 6, wherein the second noise reduction module further comprises a fourth inverter and a ninth transistor, an input end of the fourth inverter is connected to the another of the source and the drain of the seventh transistor, an output end of the fourth inverter is connected to a gate of the ninth transistor, one of a source and a drain of the ninth transistor is connected to the signal output end, and another of the source and drain of the ninth transistor is connected to the first power supply end.

9. The shift register according to claim 1, wherein the shift register further comprises a shutdown control module, the shutdown control module is connected to the first power supply end, a second power supply end, and the signal output end, and the shutdown control module is configured to provide a turn-on signal to the signal output end under the control of the first power supply end and a control of the second power supply end, such that thin film transistors connected to gate lines of a corresponding row are all turned on.

10. The shift register according to claim 9, wherein the shutdown control module comprises a second capacitor and a tenth transistor, a gate of the tenth transistor is connected to the first power supply end, one of a source and a drain of the tenth transistor is connected to the second power supply end, another of the source and the drain of the tenth transistor is connected to the signal output end, one end of the second capacitor is connected to the first power supply end, and another end of the second capacitors is connected to the second power supply end.

11. The shift register according to claim 1, wherein the input module comprises a first transistor, a gate of the first transistor is connected to the first signal control end, one of a source and a drain of the first transistor is connected to the signal input end, and another of the source and the drain of the first transistor is connected to the pull-up node.

12. The shift register according to claim 1, wherein the output module comprises a second transistor and a first capacitor, a gate of the second transistor is connected to the pull-up node, one of a source and a drain of the second transistor is connected to the clock signal end, and another of the source and the drain of the second transistor is connected to the signal output end; and
one end of the first capacitor is connected to the pull-up node, and another end of the first capacitor is connected to the signal output end.

13. The shift register according to claim 1, wherein the reset module comprises a third transistor, a gate of the third transistor is connected to the second signal control end, one of a source and a drain of the third transistor is connected to the pull-up node, and another of the source and the drain of the third transistor is connected to the first power supply end.

14. The shift register according to claim 1, wherein the first noise reduction module comprises a fourth transistor and a fifth transistor, the fifth transistor is a P-type transistor, a gate of the fourth transistor is connected to the third signal control end, one of a source and a drain of the fourth transistor is connected to the pull-up node, another of the source and drain of the fourth transistor is connected to a gate of the fifth transistor, one of a source and a drain of the fifth transistor is connected to the pull-up node, and another of the source and the drain of the fifth transistor is connected to the first power supply end.

15. The shift register according to claim 14, wherein the first noise reduction module further comprises a sixth transistor, the sixth transistor is a P-type transistor, a gate of the sixth transistor is connected to the another of the source and the drain of the fourth transistor, one of a source and a drain of the sixth transistor is connected to the signal output end, and another of the source and the drain of the sixth transistor is connected to the first power supply end.

16. The shift register according to claim 1, wherein the first noise reduction module comprises a fourth transistor, a first inverter, and a fifth transistor, a gate of the fourth transistor is connected to the third signal control end, one of a source and a drain of the fourth transistor is connected to the pull-up node, another of the source and the drain of the fourth transistor is connected to an input end of the first inverter, an output end of the first inverter is connected to a gate of the fifth transistor, one of a source and a drain of the fifth transistor is connected to the pull-up node, and another of the source and the drain of the fifth transistor is connected to the first power supply end.

17. The shift register according to claim 16, wherein the first noise reduction module further comprises a second inverter and a sixth transistor, an input end of the second inverter is connected to the another of the source and the drain of the fourth transistor, an output end of the second inverter is connected to a gate of the sixth transistor, one of a source and a drain of the sixth transistor is connected to the signal output end, and another of the source and the drain of the sixth transistor is connected to the first power supply end.

18. A gate driver circuit, comprising:
a plurality of cascaded shift registers, wherein a signal input end of a first stage shift register is connected to an initial signal end, a signal output end of an Nth stage shift register is connected to a signal input end of an N+1th stage shift register, a signal output end of the N+1th stage shift register is connected to a reset signal end of the Nth stage shift register, N≥1; wherein one of the shift registers comprises:
an input module, wherein the input module is connected to a signal input end, a first signal control end, and a pull-up node, and the input module is configured to provide a signal of the signal input end to the pull-up node under a control of the first signal control end;
an output module, wherein the output module is connected to the pull-up node, a clock signal end, and a signal output end, and the output module is configured to provide a clock signal of the clock signal end to the signal output end under a control of the pull-up node;
a reset module, wherein the reset module is connected to the pull-up node, a second signal control end, and a first power supply end, and the output module is configured to provide the clock signal of the clock signal end to the signal output end under the control of the pull-up node; and
a first noise reduction module, wherein the first noise reduction module is connected to the pull-up node, a third signal control end, and the first power supply end, and the first noise reduction module is configured to provide a signal of the first power supply end to the pull-up node under the control of the pull-up node and a control of the third signal control end.

19. The gate driver circuit according to claim 18, wherein the one of the shift registers further comprises a second noise reduction module, the second noise reduction module is connected to the pull-up node, a fourth signal control end, and the first power supply end, and the second noise reduction module is configured to provide the signal of the first power supply end to the pull-up node under the control of the pull-up node and a control of the fourth signal control end.

20. A display device, comprising:
a gate driver circuit comprising a plurality of cascaded shift registers, wherein a signal input end of a first stage shift register is connected to an initial signal end, a signal output end of an Nth stage shift register is connected to a signal input end of an N+1th stage shift register, a signal output end of the N+1th stage shift register is connected to a reset signal end of the Nth stage shift register, N≥1; wherein one of the shift registers comprises:
an input module, wherein the input module is connected to a signal input end, a first signal control end, and a pull-up node, and the input module is configured to provide a signal of the signal input end to the pull-up node under a control of the first signal control end;
an output module, wherein the output module is connected to the pull-up node, a clock signal end, and a signal output end, and the output module is configured to provide a clock signal of the clock signal end to the signal output end under a control of the pull-up node;
a reset module, wherein the reset module is connected to the pull-up node, a second signal control end, and a first power supply end, and the output module is configured to provide the clock signal of the clock signal end to the signal output end under the control of the pull-up node; and a first noise reduction module, wherein the first noise reduction module is connected to the pull-up node, a third signal control end, and the first power supply end, and the first noise reduction module is configured to provide a signal of the first power supply end to the pull-up node under the control of the pull-up node and a control of the third signal control end.

* * * * *